US012681247B2

(12) United States Patent
Wall, Jr.

(10) Patent No.: US 12,681,247 B2
(45) Date of Patent: Jul. 14, 2026

(54) THERMAL MANAGEMENT OF PLUGGABLE OPTICAL TRANSCEIVER

(71) Applicant: Infinera Corporation, Sunnyvale, CA (US)

(72) Inventor: Franklin Wall, Jr., Vacaville, CA (US)

(73) Assignee: Infinera Corporation, San Jose, CA (US)

( * ) Notice: Subject to any disclaimer, the term of this patent is extended or adjusted under 35 U.S.C. 154(b) by 1491 days.

(21) Appl. No.: 17/013,249

(22) Filed: Sep. 4, 2020

(65) Prior Publication Data

US 2021/0072473 A1 Mar. 11, 2021

Related U.S. Application Data

(60) Provisional application No. 62/896,040, filed on Sep. 5, 2019.

(51) Int. Cl.
| | | |
|---|---|---|
| *G02B 6/42* | (2006.01) | |
| *H05K 1/02* | (2006.01) | |
| *H05K 7/20* | (2006.01) | |

(52) U.S. Cl.
CPC ......... *G02B 6/4269* (2013.01); *G02B 6/4246* (2013.01); *G02B 6/4261* (2013.01); *H05K 1/0203* (2013.01); *H05K 1/0274* (2013.01); *H05K 7/2039* (2013.01); *H05K 2201/10121* (2013.01)

(58) Field of Classification Search
CPC .. G02B 6/4269; G02B 6/4246; G02B 6/4261; H05K 1/0203; H05K 1/0274; H05K 7/2039; H05K 2201/10121
See application file for complete search history.

(56) References Cited

U.S. PATENT DOCUMENTS

| | | | | |
|---|---|---|---|---|
| 9,235,017 | B1 * | 1/2016 | Meadowcroft | ........ H04B 10/40 |
| 10,616,993 | B1 * | 4/2020 | Gawlowski | .......... H05K 1/0203 |
| 11,051,431 | B2 * | 6/2021 | Marcoccia | ......... H05K 7/20663 |
| 2001/0024551 | A1 * | 9/2001 | Yonemura | ............ G02B 6/4292 |
| | | | | 385/88 |
| 2016/0064873 | A1 * | 3/2016 | Bucher | ................ H01R 12/722 |
| | | | | 439/59 |
| 2018/0337476 | A1 * | 11/2018 | Guy Ritter | ......... H05K 7/20436 |
| 2018/0368283 | A1 * | 12/2018 | Little | ..................... G02B 6/428 |
| 2019/0230817 | A1 * | 7/2019 | Han | ......................... F28F 3/06 |

* cited by examiner

*Primary Examiner* — Stephen S Sul
*Assistant Examiner* — Alexander Ryan Horton
(74) *Attorney, Agent, or Firm* — David L. Soltz

(57) ABSTRACT

Systems and devices for providing heat relief to an optical transceiver device are disclosed. The optical transceiver device includes a heat transfer structure that includes a heat slug connected to a high heat generating circuit in the optical transceiver device. The heat slug has a structure that allows heat to flow anisotropically from one surface of the heat slug that contacts the heat generating circuit to a second surface of the heat slug that is thermally coupled to a heat transfer device such as a heat sink. The perimeter of the heat slug is enclosed by an insulation frame. The insulation frame is configured to thermally isolate the heat slug by reducing heat transfer from the heat slug to other components of the optical transceiver device.

29 Claims, 6 Drawing Sheets

OPTICAL TRANSCEIVER DEVICE 100
WITH DISENGAGED CAGE 320
AND HEAT TRANSFER DEVICE 310

OPTICAL TRANSCEIVER DEVICE
100 ENGAGED WITH CAGE 320
AND HEAT TRANSFER DEVICE 310

THERMAL MANAGEMENT OF PLUGGABLE OPTICAL TRANSCEIVER

CROSS-REFERENCE TO RELATED APPLICATION

This application claims the benefit of U.S. Provisional Application No. 62/896,040, filed Sep. 5, 2019, which is incorporated herein by reference in its entirety.

FIELD

This specification generally relates to heat management in optical transceivers.

BACKGROUND

As optical systems become more compact and interconnected, heat management of the optical systems has become increasingly important. Ineffective heat management may damage circuits in the optical systems.

SUMMARY

This disclosure describes systems, methods, devices, and other implementations for managing heat transfer in optical transceivers.

An optical transceiver device may include various circuit regions that can generate different levels of heat, which, if not managed properly, may cause damage to the optical transceiver device. This disclosure describes a heat transfer structure that complements existing heat transfer devices such as fin structures and heat sinks and that may improve heat transfer capabilities in optical transceiver devices and systems. The heat transfer structure includes a heat slug that is connected to a high heat generating circuit in the optical transceiver device such as the digital signal processing (DSP) circuit. The heat slug has a structure that allows heat to flow anisotropically from one surface of the heat slug adjacent to the heat generating circuit to a second surface of the heat slug that is thermally coupled to a heat transfer device such as a heat sink.

The perimeter of the heat slug can be enclosed by an insulation frame. The insulation frame is configured to thermally isolate the heat slug by reducing heat transfer from the heat slug to other components of the optical transceiver device. In this manner, heat from a high heat generating circuit in the optical transceiver device can be directed towards a heat transfer device while reducing heat transfer to other components of the optical transceiver device.

For example, according to some implementations, an apparatus for improving heat transfer includes multiple circuit regions, a heat slug, and an insulation frame. The circuit regions include a first circuit region and a second circuit region operable to generate more heat than the first circuit region. The heat slug is disposed above the second circuit region and extends from the second circuit region to an exterior surface of the apparatus. The insulation frame surrounds the heat slug adjacent to the exterior surface of the apparatus and is configured to reduce heat transfer from the heat slug and second circuit region to the first circuit region.

In some implementations, a system that improves heat transfer includes an optical transceiver device and a heat transfer device. The optical transceiver device includes a plurality of circuit regions, a heat slug, and an insulation frame. The heat slug is disposed above one of the circuit regions and extends from the one of the circuit regions to an exterior surface of the optical transceiver device. The insulation frame surrounds the heat slug adjacent to the exterior surface of the optical transceiver device and is configured to insulate heat from the heat slug. The heat transfer device directly contacts the heat slug and is configured to reduce heat transfer from the heat slug and one of the circuit regions to other circuit regions of the optical transceiver device In some implementations, a quad small form factor pluggable double density device (QSFP-DD) is coupled to a heat sink. The QSFP-DD includes a heat slug and an insulation frame. The heat slug is disposed above a digital signal processing circuit, extends from the digital signal processing circuit to an exterior surface of the QSFP-DD, and contacts the heat sink. The heat slug includes a tab. The insulation frame surrounds the heat slug adjacent to the exterior surface of the QSFP-DD and is configured to thermally isolate the heat slug. A surface of the insulation frame is recessed from a surface of the heat slug. The insulation frame includes a first portion and a second portion. The first portion is disposed at the surface of the insulation frame. The second portion is disposed underneath the first portion and separated from the first portion by a gap. The gap is filled by the tab such that a top surface of the tab directly contacts the first portion and a bottom surface of the tab directly contacts the second portion.

The heat transfer structure(s) described in this disclosure can be advantageous to provide an affordable, cost-effective solution to optimizing heat management in optical transceiver devices and systems. Heat can be transferred vertically and through a short thermal path to a heat transfer device while isolating other components of the optical transceiver device from the heat conducted through that path. In this manner, heat transfer is efficiently controlled and directed to a device that can provide heat relief to the optical transceiver device. This heat transfer structure can generally be applied to various circuits of the optical transceiver device that generate high levels of heat.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figures 1A, 1B:
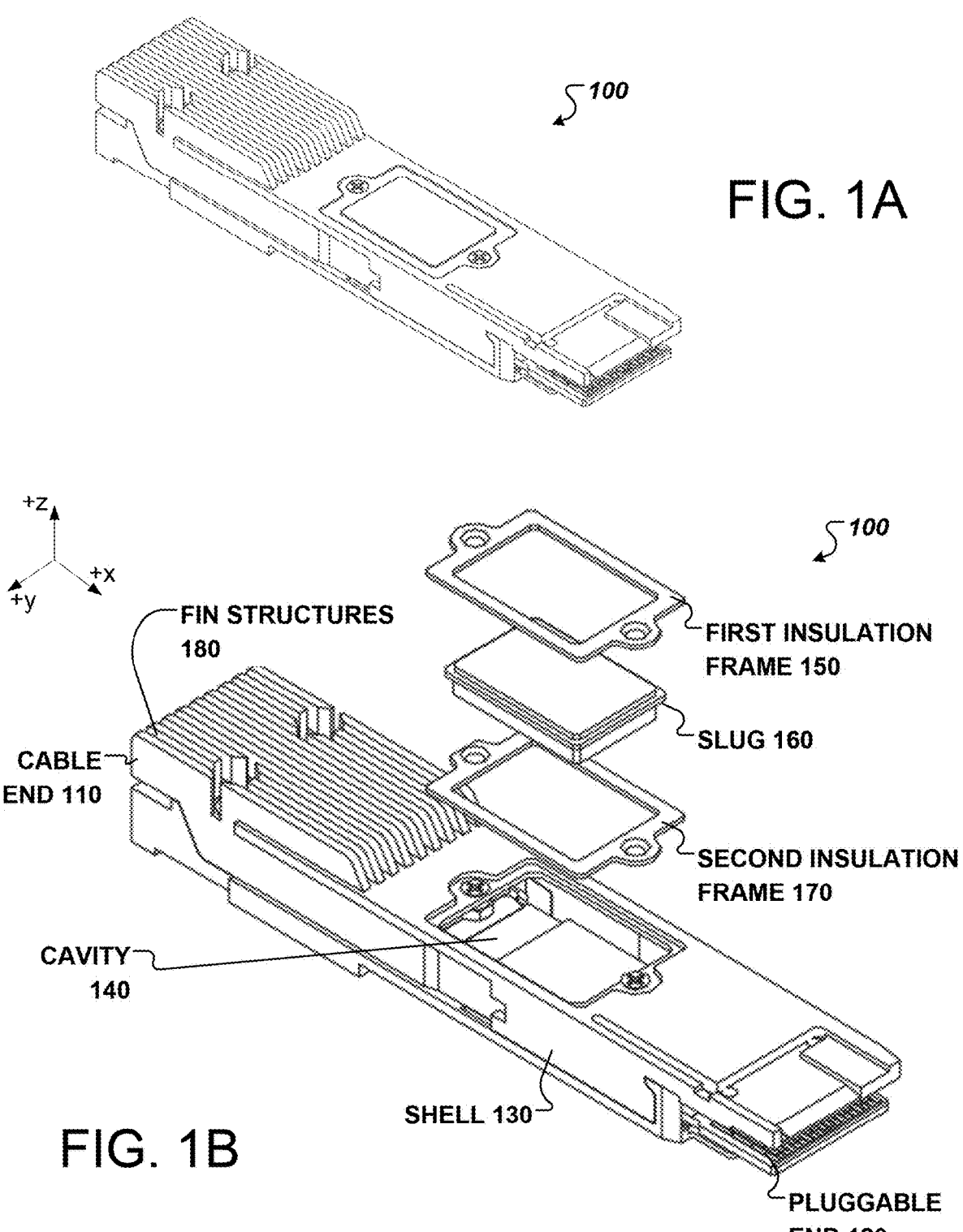
FIG. 1A depicts an example of an optical transceiver device.
FIG. 1B depicts an example of an exploded view of the optical transceiver device.

Optical transceiver devices can be used to connect electronic devices like network servers or switches to data transportation structures such as copper or fiber cables. As 5G technology continues to evolve and the market demands greater storage capabilities and higher speeds, it has become increasingly important that optical transceiver devices be designed to support faster speeds and larger data transfers while managing density, bandwidth, and thermal issues.

To facilitate thermal management, optical transceiver devices may be coupled to a heat sink to provide relief from excess heat in regions of the optical transceiver devices where circuits are deployed. However, this method of heat dissipation through the use of a heat sink may present several limitations. For example, the amount of heat dissipated may depend on ambient temperature and airflow. In addition, for optical transceiver devices with multiple regions of integrated circuits (ICs), heat generated from one region may spread to another region, thereby causing regions with less heat to receive heat from other regions with higher heat. When heat spreads from one IC region to another, the heat dissipation effectiveness of the heat sink decreases considerably, leaving the optical transceiver device vulnerable to damage from excessive heat.

Some optical transceiver devices include, or may be coupled to, devices such as, e.g., thermoelectric coolers (TECs) and heat sinks to manage heat generated by the circuits. For example, when an optical transceiver device includes a laser, a TEC may be used to provide heat relief to the laser. However, the DSP circuit of an optical transceiver device often generates heat greater than the amount of heat for which the TEC is configured to provide heat relief. In such cases, the TEC and other heat relief mechanisms may not provide sufficient heat relief to the optical transceiver device.

To address at least some of the foregoing issues, a heat transport structure is incorporated into an optical transceiver device such that heat is transferred from a circuit region of the optical transceiver device that generates high levels of heat to the heat sink through a heat slug. The heat slug may be formed of conductive material, such as, e.g., copper, that provides a high thermal conductivity path from the high heat generating circuit region of the optical transceiver device to a heat transfer device, such as a heat sink, in a vertical (+z) direction towards an exterior surface of the optical transceiver device. More generallly, the heat slug may be a heat transfer material or heat spreader with a relatively flat surface that is configured to transfer heat from a portion of the optical transceiver that has a high temperature and generates substantial amount of heat, e.g., a portion having a heat generating IC chip such as a DSP chip, to a region that has a lower temperature than the portion of the optical transceiver having a high temperature and can provide thermal relief to the IC chip. The region with a lower temperature may be another device such as a heat sink.

An insulating flange may surround the perimeter of the heat slug. The insulating flange may be formed of highly insulating material such as a nickel-cobalt ferrous (e.g., KOVAR™), and may be configured to reduce or prevent heat from being transferred horizontally to other regions of the optical transceiver device. In this manner, heat can be transferred, in a controlled manner, from the desired IC region to the heat sink without heat dissipating to other circuit regions of the optical transceiver device.

Additional details and benefits of the heat transferring structure used in optical transceiver systems and devices are described below with reference to the figures.

FIG. 1A illustrates an example of an optical transceiver device 100. The optical transceiver device 100 includes a transmitter and a receiver (TROSA). The transmitter in the optical transceiver device 100 may generate an electrical signal at a certain code rate to drive a semiconductor laser (LD) or an optical emitting diode (LED) to emit a modulated optical signal of a corresponding rate through a medium such as a fiber optic cable. The receiver in the optical transceiver device 100 is operable to receive an optical signal input at a certain code rate, and to convert the optical signal to an electrical signal using, for example, a photodetecting diode for further processing.

In general, the optical transceiver device 100 may be configured to transport data between a data-transferring component such as, e.g., a copper or fiber optic cable, and an electronic device such as, e.g., a server or network switch. One end of the optical transceiver device 100 can be plugged into a port of the electronic device, and another end connected to the data-transferring component. Because the optical transceiver device 100 operates, in part, as an interface between a data-transferring component and an electronic device, an optical transceiver also may be referred to as a network interface device.

In general, an optical transceiver device 100 can be implemented in various shapes, sizes, and configurations. In some implementations, the optical transceiver device 100 may be a small form-factor pluggable (SFP) device, which is a compact, hot-pluggable network interface module used for both telecommunication and data communications applications. An SFP interface on networking hardware is a modular (plug-and-play) slot for a media-specific transceiver in order to connect a fiber-optic cable or sometimes a copper cable.

Examples of SFP devices include, but are not limited to, a Quad Small Form-factor Pluggable (QSFP) device and a QSFP-DD (QSFP-Double Density). QSFPs include additional lanes relative to other SFPs to support four times faster speeds (e.g., up to 200 Gbit/s) than corresponding SFPs. QSFP-DDs are similar to QSFP but include an additional row of contacts providing for an eight lane electrical interface. QSFP-DD devices can offer double (e.g., up to 400 Gbit/s) the speed of QSFPs. With such high data transfer speeds and dense circuitry supporting the data transfer within the optical transceiver, effective thermal management is desired to prevent overheating, as explained above. This disclosure describes optical transceivers with the capability to dissipate heat effectively through the use of a heat transport structure.

FIG. 1B depicts an example of an exploded view of the optical transceiver device 100. The optical transceiver device 100 includes a fiber cable end 110, a pluggable end 120, a shell 130, a cavity 140, fin structures 180, and a heat transfer structure that includes a slug 160, a first insulation frame 150, and a second insulation frame 170. The fiber cable end 110 is connected to the data-transferring component such as, e.g., a copper or fiber optic cable. The fiber cable end 110 may include fiber connectors and/or one or more interfaces to facilitate the connection with the data-transferring component. The pluggable end 120 is configured to be inserted into a cage (not shown in FIG. 1). The pluggable end 120 may include extensions or fingers with mechanical and electrical interfaces configured to be plugged into the cage and coupled to one or more components of the cage.

Housing or shell 130 provides the external structure or skeleton for the optical transceiver device 100 and provides protection to components within the optical transceiver device 100 from external forces and elements. The components may include various types of optical subassemblies, integrated chips (ICs), Application-Specific Integrated Circuits (ASICs), and electronic circuits such as, e.g., controllers, processors such as digital signal processors (DSPs), analog-to-digital converters, digital-to-analog converters, amplifiers, storage devices, filters, and/or photodiodes.

Shell 130 extends from the fiber cable end 110 to the pluggable end 120 and accommodates the internal components of the optical transceiver device 100. In general, the shell may be made of any suitable material such as, e.g., aluminum, zinc, or a combination thereof, that can withstand environmental and thermal fluctuations and provide structural support to internal components of the optical transceiver device 100.

The optical transceiver device 100 also may include one or more components to facilitate heat management of the optical transceiver. For example, the optical transceiver device 100 may include fin structures 180 to assist in thermal dissipation of the heat load from one or more circuit regions or TROSA located beneath the fin structures 180. In some implementations, the dimensions (e.g., depth) of the fin structures 180 may conform to the specifications set forth by the Multi-Source Agreement (MSA) issued by the industry-recognized Small Form Factor Committee.

The amount of heat dissipated by the fin structures 180 may depend, at least in part, on the heat generated by the circuits and devices within the optical transceiver device 100, the airflow, the ambient temperature, and the depth of the fin structures 180. At times, the fin structures 180 may not be sufficient to transfer heat away from the circuit regions of the optical transceiver device 100. When this situation occurs, components within the optical transceiver device 100 may become structurally and/or functionally damaged.

To further facilitate heat management and address the above-noted issue, the optical transceiver device 100 may include a heat transfer structure placed within cavity 140 of the optical transceiver device 100 to transfer heat away from one or more circuit regions of the optical transceiver device 100. In particular, cavity 140 may be formed directly above a chip or circuits that generate high levels of heat. For example, a DSP chip may produce some of the highest levels of heat in an optical transceiver device 100. An opening in the shell 130 may be formed to expose the cavity 140 above the DSP chip.

The heat transfer structure includes a slug 160 and an insulation frame comprised of two parts, namely, a first insulation frame 150 and a second insulation frame 170. The slug 160 may be formed of a high thermal conductive material such as, but not limited to, e.g., copper, tungsten, or a mixture thereof. One (bottom) surface of the slug may directly or indirectly contact a surface of the chip that generates high levels of heat, e.g., the DSP chip, so that thermal energy may be transferred from the chip to the slug 160.

The slug 160 may extend vertically from a region adjacent to the surface of the chip that generates high levels of heat to a level parallel to a top surface of the optical transceiver device 100 such that a top surface of the slug 160 is flush with the top surface of the optical transceiver device 100. The top surface of the optical transceiver device 100 may be an exterior shell surface of the optical transceiver device 100, and may contact a heat transfer device, such as a heat sink when the optical transceiver device 100 engages with the heat transfer device. In addition, when the optical transceiver device 100 engages with the heat transfer device, the top surface of the slug 160 may be in direct contact with the heat transfer device. The slug 160 may include an anisotropic carbon material that has a z-axis (vertical) conductivity greater than a x-y plane (horizontal) conductivity such that thermal conduction occurs primarily in a positive z-axis direction towards the top surface of the slug 160. In this way, heat from the chip that is operable to generate high levels of heat is transferred to the heat transfer device through the slug 160.

The slug 160 may fill the length and width of the opening in the shell 130 that exposes the cavity 140. A central portion of the slug 160 may include an extension or tab. For instance, a length and/or width of the central portion of the slug 160 may be greater than a length and width of a top and a bottom portion of the slug 160, respectively.

The insulation frame, including the first insulation frame 150 and the second insulation frame 170, may provide structural support to the slug 160. The first insulation frame 150 may be disposed above the second insulation frame 170 and separated from the second insulation frame 170 by a determined gap that is filled by the slug 160. For example, a top surface of the extension or tab extending from the central portion of the slug 160 may contact a bottom surface of the first insulation frame 150. A bottom surface of the extension or tab extending from the central portion of the slug 160 may contact a top surface of the second insulation frame 150. The gap that vertically separates the first insulation frame 150 and the second insulation frame is thus filled by the extension or tab of the slug 160. In some implementations, a gap filler tape may also be used to secure the slug 160 to the insulation frame.

The insulation frame is disposed on a top surface of the optical transceiver device 100 adjacent to the fin structures 180, as shown in FIG. 1B. One or more ends of the insulation frame may include an opening. The opening may be configured to receive a fastener to secure the insulation frame and slug 160 to the optical transceiver device 100. For example, a screw may be inserted within the opening to fasten the insulation frame and slug 160 to the optical transceiver device 100. In general, various types of fasteners may be used, and the shape of the opening may be customized based on the type of fastener used.

The insulation frame may be slightly recessed from a top surface of the slug 160 and the top, exterior surface of the optical transceiver device 100. For example, a top surface of the first insulation frame 150 may be recessed from a top surface of the slug 160 and the top exterior surface of the optical transceiver device 100 by about 120-130 micrometers.

Figures 2A, 2B:
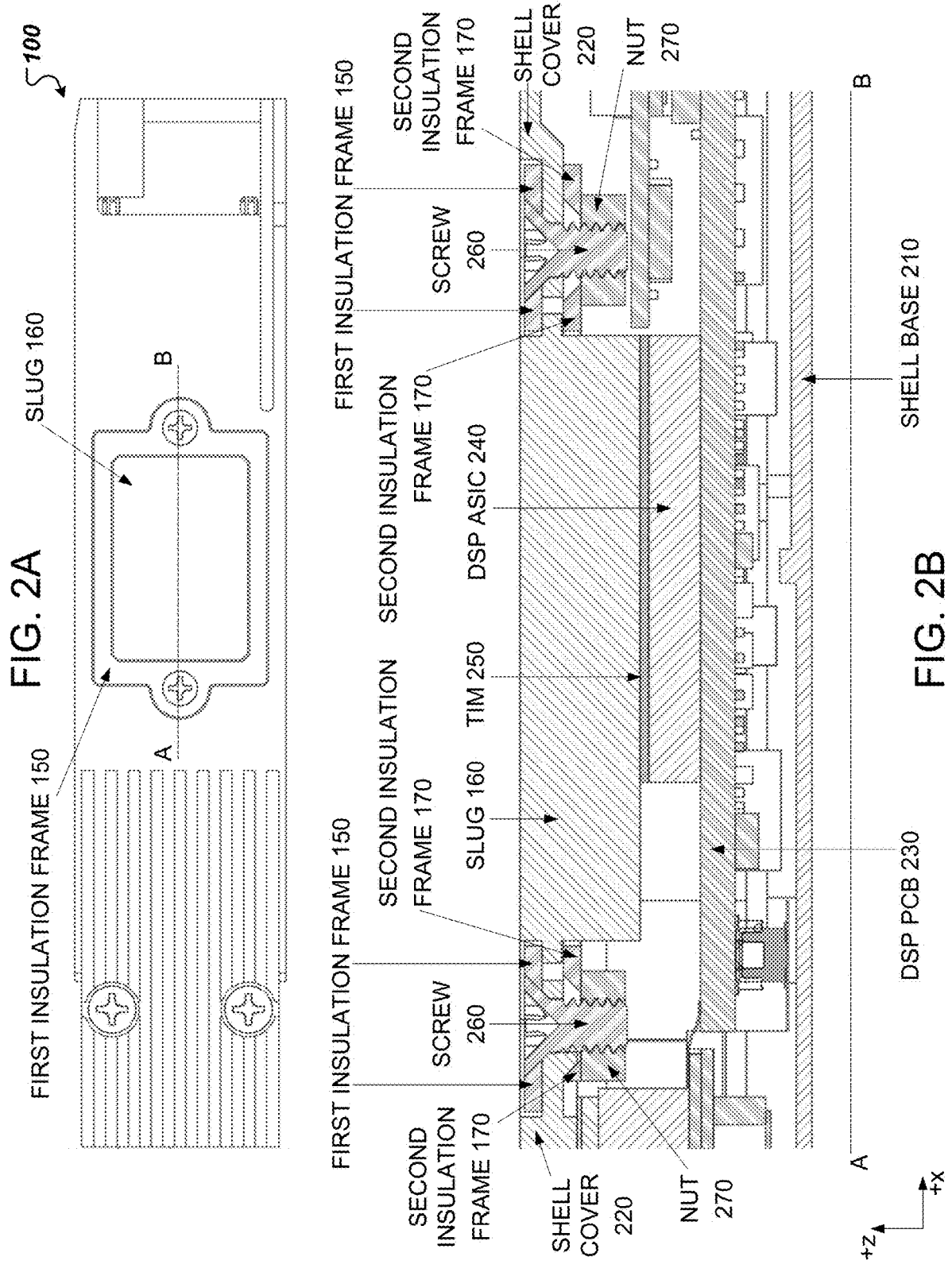
FIG. 2A depicts an example of a top view of an optical transceiver device with a heat slug.
FIG. 2B depicts an example of a side view of an optical transceiver device with a heat slug.

FIG. 2A depicts an example of a top view of an optical transceiver device 100 with a heat slug 160. FIG. 2B depicts an example of a side view of an optical transceiver device 100 with a heat slug 160. The side view shown in FIG. 2B represents the view along line A-B in FIG. 2A. As shown in FIG. 2A, the first insulation frame 150 may surround the perimeter or four sides of the slug 160 and is secured to the optical transceiver device 100 using two fasteners on each side of the first insulation frame 150. The slug 160 may be exposed in a central portion of the top surface of the optical transceiver device 100.

As explained in connection with FIG. 1B, housing or shell 130 provides the external structure or skeleton for the optical transceiver device 100 and provides protection to components within the optical transceiver device 100 from external forces and elements. As shown in FIG. 2B, the shell 130 may include a shell base 210 that forms the bottom surface of the optical transceiver device 100. Shell cover 220 may form a top surface of the optical transceiver device 100 along with one or more sidewalls of the optical transceiver device 100. As noted above, between the shell cover 220 and the shell base 210, the optical transceiver device 100 includes various components such as optical subassemblies, integrated chips (ICs), Application-Specific Integrated Circuits (ASICs), controllers, processors such as digital signal processors (DSPs), analog-to-digital converters, digital-to-analog converters, amplifiers, storage devices, filters, and/or photo-diodes (not all are labeled in the figures).

In particular, a DSP ASIC 240 may be disposed on a DSP printed circuit board (PCB) or substrate 230. The DSP ASIC 240 may execute many of the protocols and functions of the optical transceiver device 100 and may generate a substantially high amount of heat. With heat management mechanisms, the heat generated by the DSP ASIC 230 may cause damage to other components, and, in particular, optical subassemblies or heat-sensitive components such as lasers.

In some implementations, a conductive thermal interface material (250) may be disposed on a top surface of the DSP ASIC 240. The TIM 250 may also be used to transfer heat away from one or more regions of the optical transceiver device 100 such as the DSP ASIC 240 to another region of the optical transceiver device 100, or, more generally, to or from any device the TIM 250 is thermally connected to. In some implementations, the TIM 250 may be used to provide an additional thermal path to transfer heat to other heat relieving components. When disposed between the DSP ASIC 240 and slug 160, the TIM 250 may transfer heat from the DSP ASIC 240 to the slug 160 and/or any other heat-relieving component connected to the TIM 250 thereby facilitating heat management of the optical transceiver device 100.

Slug 160 may be disposed on the TIM 250 or, in implementations in which a TIM is not used, the slug 160 may be disposed directly on a top surface of the DSP ASCI 240. Slug 160 may extend vertically to a top surface of the optical transceiver device 100 and may be flush with the top exterior surface of the optical transceiver device 100. As explained above with reference to FIG. 1B, the slug 160 provides a vertical thermal path to remove heat away from the DSP ASIC 240.

A first insulation frame 150 and a second isolation frame 170 are disposed on two sides of the slug 160 at the top exterior surface of the optical transceiver device 100. On the sides of the first insulation frame 150 and the second isolation frame 170 in contact with the slug 160, a horizontal extension or tab of the slug 160 may be inserted into the gap between the first insulation frame 150 and the second isolation frame 170. In this manner, the slug 160 can be secured within the optical transceiver device 100.

On the sides of the first insulation frame 150 and the second isolation frame 170 that are not in contact with the slug 160, a portion of the shell cover 220 may fill the gap between the first insulation frame 150 and the second isolation frame 170. The first insulation frame 150 and the second isolation frame 170 are affixed to the optical transceiver device using a fastener such as screw 260 on both sides of the slug 160. A nut 270 may be used to fasten the screw 260 in place and to reduce the likelihood of the screw 260 coming loose.

Figure 3A:
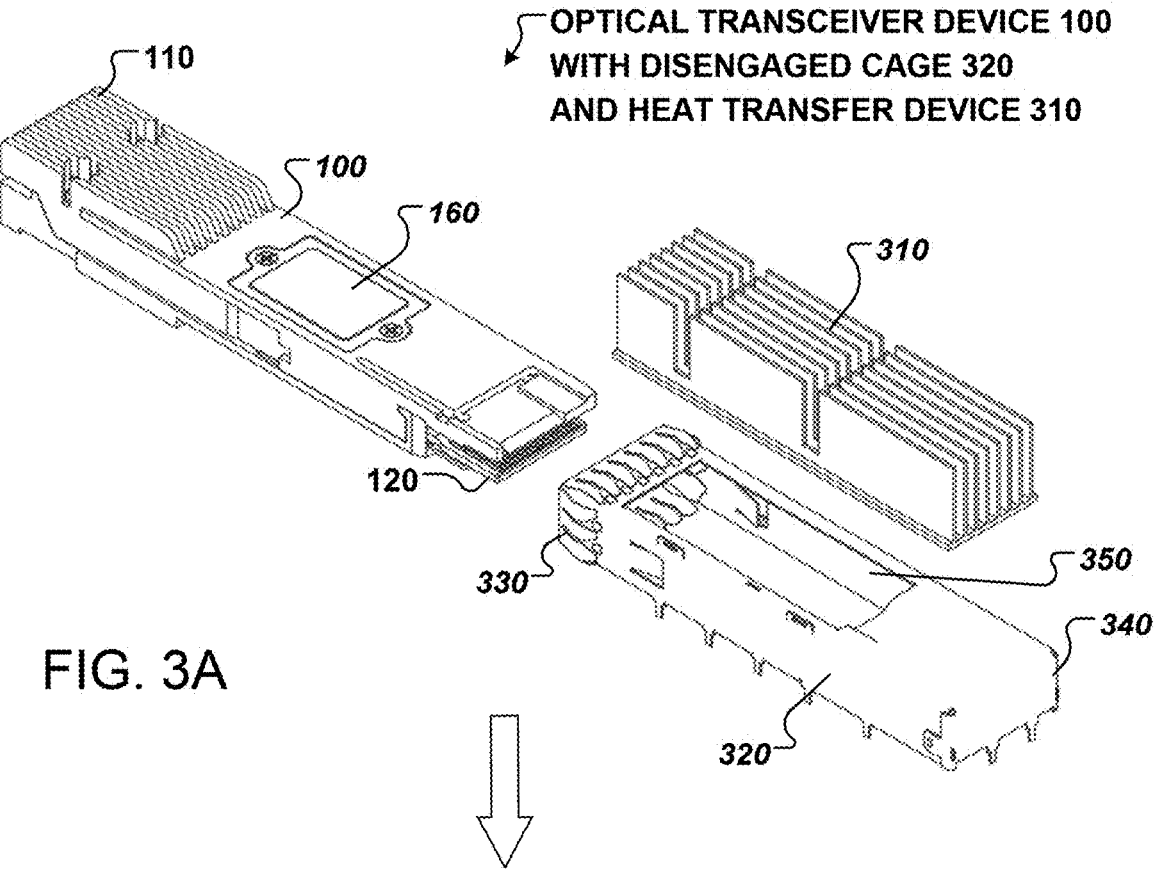
FIG. 3A depicts an example of an optical transceiver device disengaged with a heat transfer device and a cage.

The previous figures depict various views of the optical transceiver device 100. FIG. 3A depicts an example of an optical transceiver device 100 about to be engaged with a heat transfer device 310 and a cage 320. FIGS. 3B through 6 depict implementations when the optical transceiver device 100 is engaged with the heat transfer device 310.

Turning to FIG. 3A, to couple the optical transceiver device 100 to the heat transfer device 310, a cage 320 may be used. The example cage 320 shown in FIGS. 3A and 3*b* may include, among various other components, a housing or shell 340, a pluggable end 330, and an opening 350. Shell 340 provides the external structure or skeleton to provide structural support and protection to components within the shell 340. The components within the shell 340 provide an interface between the optical transceiver device 100 and the heat transfer device 310. In some implementations, the design, including thermal and mechanical specifications, of the shell 340 may comply with the specifications of the MSA.

Figure 3B:
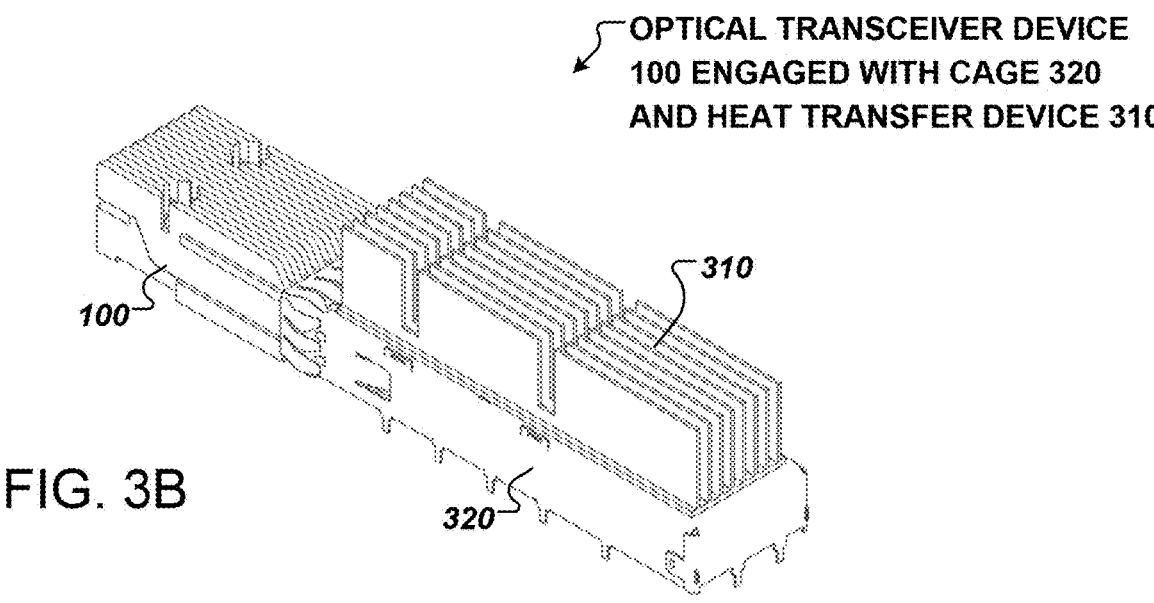
FIG. 3B depicts an example of an optical transceiver device engaged with a heat transfer device and a cage.

The pluggable end 330 of the cage 320 may be configured to be engaged with the optical transceiver device 100. In particular, the pluggable end 330 of the cage 320 may have a first opening to allow the pluggable end 120 of the optical transceiver device 100 to be inserted into the cage 320, as shown in FIG. 3B. The pluggable end 330, and more generally the cage 320, may include one or more locking mechanisms such as, e.g., fasteners, that provide resistance to the decoupling of the cage 320 and the optical transceiver device 100 once the cage 320 and the optical transceiver device 100 are coupled together.

Cage 320 may also include a second opening 350 that exposes a cavity within the cage 320. The cavity accommodates the optical transceiver device 100 when inserted into and engaged with the cage 320. When the optical transceiver device 100 is inserted into the cage 320, the second opening 350 exposes a top surface of the optical transceiver device 100, e.g., a top surface of slug 160.

In FIG. 3B, a heat transfer device 310 is engaged with the cage 320 and the optical transceiver device 100. In general, the heat transfer device 310 may refer to a passive electronic component configured to transfer heat generated by an electronic or a mechanical device to another medium, e.g., air, liquid. In some implementations, the heat transfer device 310 may be a heat sink.

The heat transfer device 310 may be mechanically and electrically connected to the cage 320 and/or the optical transceiver device 100 in various configurations. In the implementation depicted in FIG. 3B, a spring-loaded heat transfer device 310 may be disposed on top of the cage 320 and the optical transceiver device 100. The cage 320 may provide structural support so that the heat transfer device 310 can engage with the optical transceiver device 100.

Furthermore, as noted above, the second opening 350 in cage 320 exposes portions of the optical transceiver device 100 when inserted into the cage 320. When the heat transfer device 310 is disposed on the cage 320, the heat transfer device 310 may be thermally coupled, directly or indirectly, to the slug 160. Through this coupling, heat may be transferred away from the slug 160 and towards the heat transfer device 310. The heat transfer device 310 may transfer heat from the slug 160 to the ambient environment, e.g., air, thereby allowing the temperatures of the second circuit region 160 to be managed (e.g., cooled). This heat transfer device 310 may include one or more fans to direct and control airflow in a particular direction, e.g., from the fiber cable end 110 of the optical transceiver device 100 to an end of the heat transfer device 310 facing away from the optical transceiver device 100.

In some implementations, additional cooling capacity and elements may be included in the heat transfer device 310 to provide additional heat relief to the optical transceiver device 100. In some implementations, the cage 320 and heat transfer device 310 are assembled into a rack box.

Figures 4A, 4B:
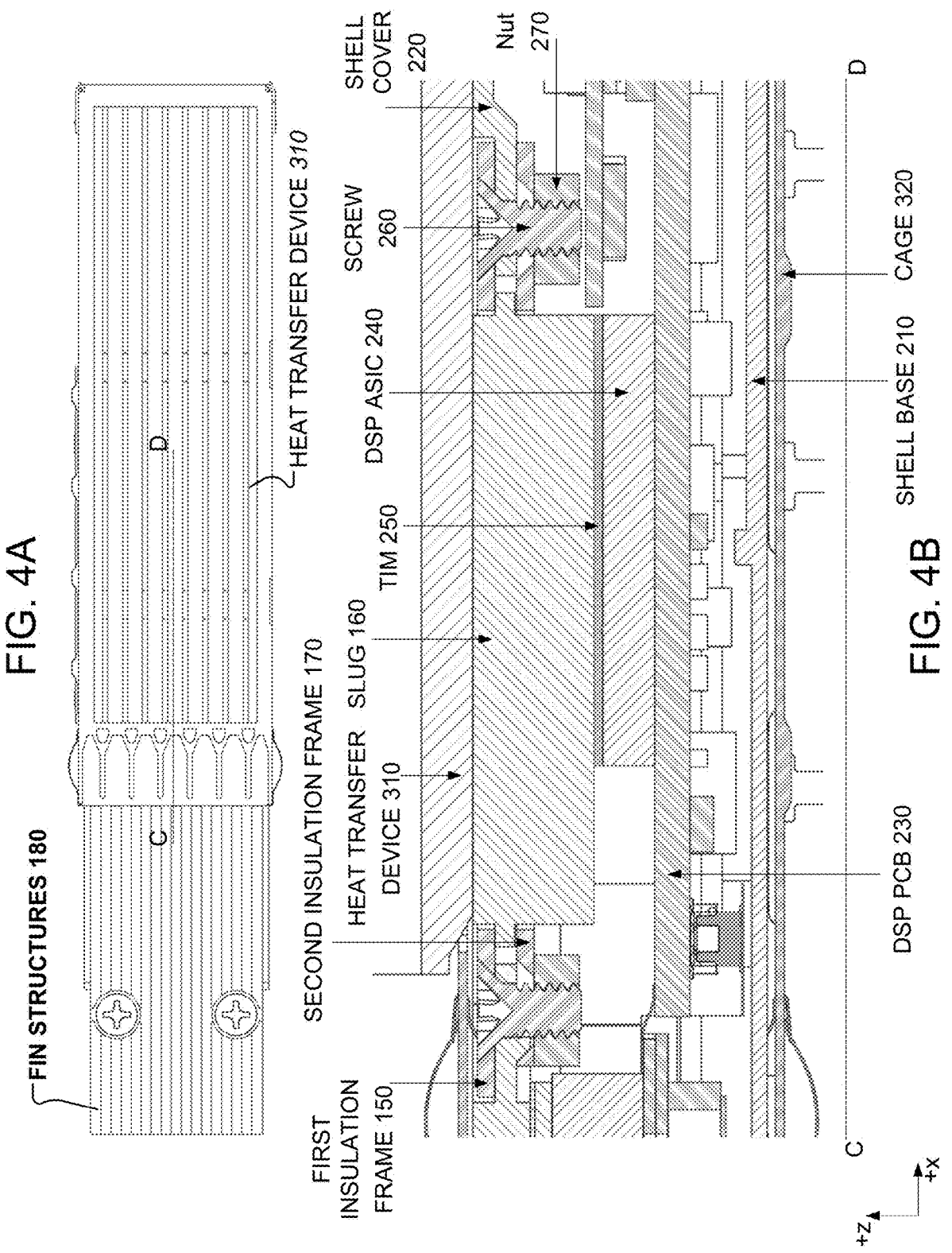
FIG. 4A depicts an example of a top view of an optical transceiver device with a heat slug engaged with a heat transfer device.
FIG. 4B depicts an example of a side view of an optical transceiver device with a heat slug engaged with a heat transfer device.

FIGS. 4A and 4B are similar to FIGS. 2A and 2B, respectively, which depict the top and side views of the optical transceiver device 100 by itself. FIG. 4A depicts an example of a top view of the optical transceiver device 100 shown in FIG. 2A additionally engaged with the heat transfer device 310. FIG. 4B depicts an example of a side view of the optical transceiver device 100 shown in FIG. 2B additionally engaged with the heat transfer device 310. The side view shown in FIG. 4B represents the view along line C-D in FIG. 4A.

FIG. 4A, in comparison with FIG. 2A, illustrates a heat transfer device 310 disposed on top of the optical transceiver device 100. Of the various components of the optical transceiver device 100, fin structures 180 are viewable from the top view. Other parts of the optical transceiver device 100 are obscured by the heat transfer device 310.

FIG. 4B shows a bottom surface of the heat transfer device 310 contacting a top exterior surface of the optical transceiver device 100 including a top surface of the slug 160. The bottom surface may be formed of a suitable conductive material, such as copper or aluminum. Contact between the bottom surface of the heat transfer device 310 and a top surface of the slug 160 provides a thermal path that allows heat from the DSP ASIC 240 to be transferred to the heat transfer device 310. Heat transferred from the DSP ASIC 240 to the heat transfer device 310 can then be released into the air as explained above. Because the slug 160 has anisotropic thermal conductivity that directs thermal energy in a vertical (+z) direction, horizontal heat transfer from the slug 160 or DSP ASIC 240 to other circuit regions that generally generate less heat is reduced.

Figures 5A, 5B:
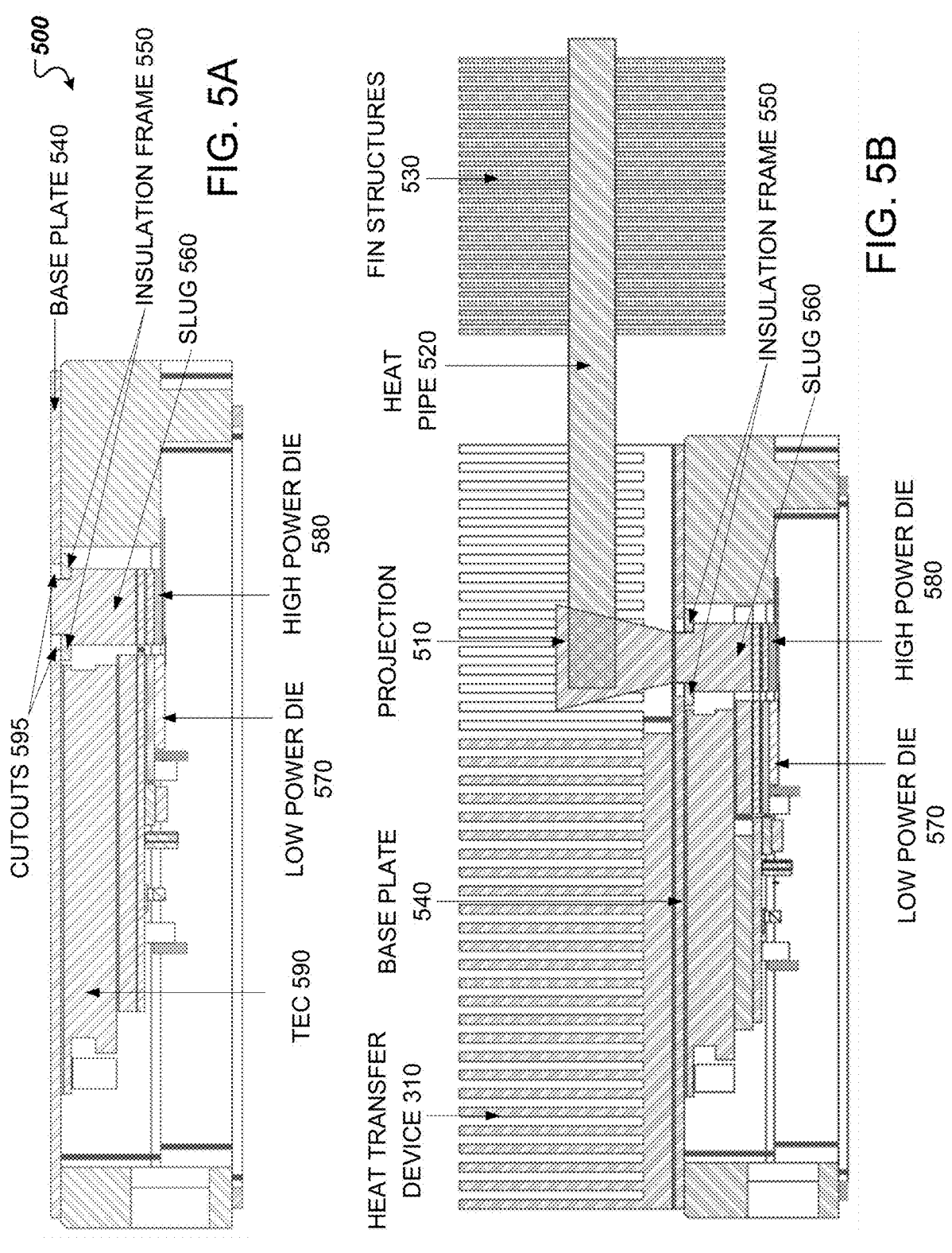
FIG. 5A depicts an example of a side view of an optical transceiver device with a heat slug.
FIG. 5B depicts an example of a side view of an optical transceiver device with a heat slug engaged with a heat transfer device, heat pipes, and a fin structure.

FIG. 5A depicts an example of a side view of an optical transceiver device 500 with a heat slug 560. The optical transceiver device 500 includes a plurality of dies that generate different amounts of heat in operation. A low power die 570 is formed and is displaced horizontally from the high power die 580. Slug 560 is similar to slug 160 described above. Slug 560 may be disposed on the high power die 580 to provide heat transfer away from the high power die 580, which provides some protection to the low power die 570.

The optical transceiver device 500 also may include a thermoelectric cooler (TEC) 590 that provides relief for the heat load generated by the other components of the optical transceiver device 500 such as the low power die 570.

The top surface of the optical transceiver device 500 may be formed of a base plate 540. The base plate 540 may be formed of a suitable conductive material such as, e.g., copper, tungsten, or a combination thereof. A top surface of the base plate 540 may be level with a top surface of the slug 560. Insulation frame 550 may secure the slug 560 in position as described above. The base plate 540 may include one or more cutouts 595 that allow the slug 560 to be thermally isolated from the base plate 540. Due to the cutouts 595, heat from the slug 560 does not transfer onto the base plate 540. Therefore, heat from the high power die 580 can be transferred substantially through the slug 560.

FIG. 5B depicts an example of a side view of an optical transceiver device 500 engaged with the heat transfer device 310, one or more heat pipes 520, and fin structures 530. The base plate 540 of the optical transceiver device 500 of FIG. 5A may be connected to the heat transfer device 310. This connection allows heat to flow from various components of the optical transceiver device 500 such as the low power die 570 to the heat transfer device 310 for release into the air.

The optical transceiver device 500 may also be connected to one or more heat pipes 520 and fin structures 530 using a projection 510. Projection 510 may be a thermal conductive material to facilitate heat transfer away from the optical transceiver device 500. For example, the projection 510 may be implemented as a vapor chamber or a copper slug. One end of the projection 510 may be connected to the slug 560, and a second end of the projection 510 may be connected to one or more heat pipes 520.

Figure 6:
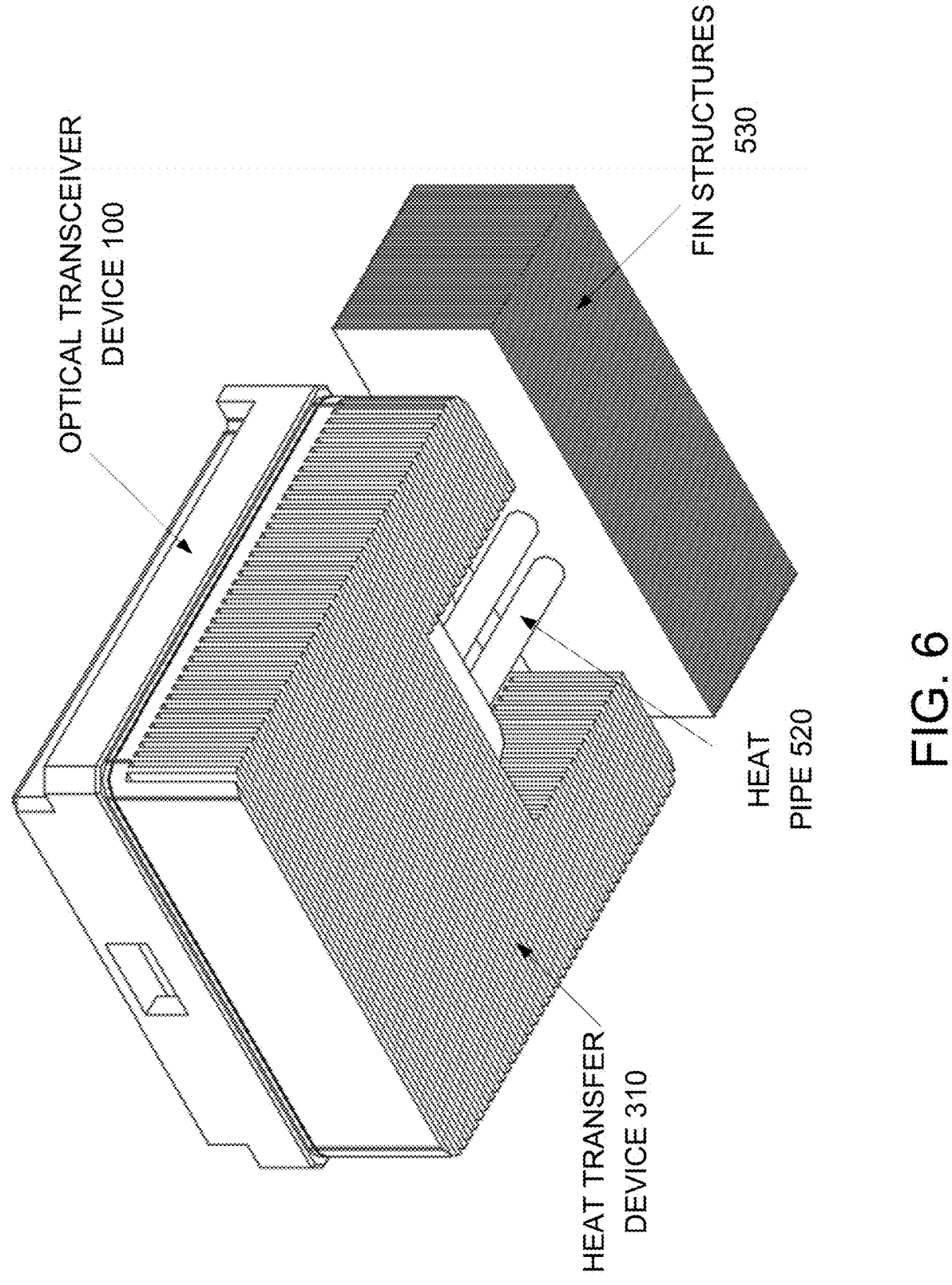
FIG. 6 depicts an example of a three-dimensional view of an optical transceiver device with a heat slug engaged with a heat transfer device, heat pipes, and a fin structure.

The one or more heat pipes 520 may be connected to fin structures 530 and may provide a thermal path from the projection 510 to the fin structures 530. Thus, heat generated by the high power die 580 may be transferred through the slug 560 to the projection 510, one or more heat pipes 520, and the fin structure 530. FIG. 6 depicts an example of a three-dimensional view of the optical transceiver device 500 connected to the heat transfer device 310, the one or more heat pipes 520, and the fin structures 530.

While this specification contains many specifics, these should not be construed as limitations on the scope of the disclosure or of what may be claimed, but rather as descriptions of features specific to particular implementations. Certain features that are described in this specification in the context of separate implementations may also be combined. Conversely, various features that are described in the context of a single implementation may also be implemented in multiple implementations separately or in any suitable sub-combination. Moreover, although features may be described above as acting in certain combinations and may even be claimed as such, one or more features from a claimed combination may, in some cases, be excised from the combination, and the claimed combination may be directed to a sub-combination or variation of a sub-combination. For example, the separation of various system components in the implementations described above should not be understood as requiring such separation in all implementations.

Terms used herein and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together. The term "and/or" is also intended to be construed in this manner.

The use of the terms "first," "second," "third," etc., are not necessarily used herein to connote a specific order or number of elements. Generally, the terms "first," "second," "third," etc., are used to distinguish between different elements as generic identifiers. Absent a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

What is claimed is:

1. An apparatus comprising:
a plurality of circuit regions comprising a first circuit region and a second circuit region operable to generate more heat than the first circuit region;
a heat slug disposed above the second circuit region, the heat slug extending from the second circuit region to an exterior surface of the apparatus; and
an insulation frame surrounding the heat slug adjacent to the exterior surface of the apparatus and configured to reduce heat transfer from the heat slug and second circuit region to the first circuit region, wherein the insulation frame comprises:
a first portion disposed at a surface of the insulation frame; and
a second portion disposed underneath the first portion and separated from the first portion by a gap; and
the heat slug comprises a tab configured to be inserted into the gap and be affixed to the insulation frame, a top surface of the tab directly contacting the first portion and a bottom surface of the tab directly contacting the second portion.

2. The apparatus of claim 1, wherein a surface of the insulation frame is recessed from a surface of the heat slug.

3. The apparatus of claim 1, wherein a surface of the insulation frame is recessed from a surface of the heat slug by 120-130 micrometers.

4. The apparatus of claim 1, wherein:
the heat slug comprises at least one of copper and tungsten; and
the heat slug is configured to transfer heat away from the second circuit region to another device having a temperature lower than a temperature of the second circuit region.

5. The apparatus of claim 1, wherein the heat slug is a heat spreader comprising an anisotropic carbon material that has a z-axis conductivity greater than a x-y plane conductivity.

6. The apparatus of claim 1, wherein the insulation frame comprises a nickel-cobalt ferrous alloy.

7. The apparatus of claim 1, wherein each of the first portion and the second portion comprises a respective hole configured to receive a fastener to fasten the insulation frame to the apparatus.

8. The apparatus of claim 1, wherein:
the first circuit region comprises an optical subassembly;
the second circuit region comprises a digital signal processor chip; and
a conductive thermal interface material is disposed between the second circuit region and the heat slug.

9. An apparatus of claim 1, comprising:
a plurality of circuit regions comprising a first circuit region and a second circuit region operable to generate more heat than the first circuit region;
a heat slug disposed above the second circuit region, the heat slug extending from the second circuit region to an exterior surface of the apparatus; and
an insulation frame surrounding the heat slug adjacent to the exterior surface of the apparatus and configured to reduce heat transfer from the heat slug and second circuit region to the first circuit region; and
a housing configured to accommodate the plurality of circuit regions, the heat slug, and the insulation frame, wherein a surface of the heat slug is flush with a surface of the housing.

10. The apparatus of claim 9, wherein a surface of the insulation frame is recessed from a surface of the heat slug.

11. The apparatus of claim 9, wherein a surface of the insulation frame is recessed from a surface of the heat slug by 120-130 micrometers.

12. The apparatus of claim 9, wherein:
the heat slug comprises at least one of copper and tungsten; and
the heat slug is configured to transfer heat away from the second circuit region to another device having a temperature lower than a temperature of the second circuit region.

13. The apparatus of claim 9, wherein the heat slug is a heat spreader comprising an anisotropic carbon material that has a z-axis conductivity greater than a x-y plane conductivity.

14. The apparatus of claim 9, wherein the insulation frame comprises a nickel-cobalt ferrous alloy.

15. The apparatus of claim 9, wherein:
the first circuit region comprises an optical subassembly;
the second circuit region comprises a digital signal processor chip; and
a conductive thermal interface material is disposed between the second circuit region and the heat slug.

16. A system comprising:
an optical transceiver device comprising:
a plurality of circuit regions;
a heat slug disposed above one of the plurality of circuit regions, the heat slug extending from the one of the plurality of circuit regions to an exterior surface of the optical transceiver device; and
an insulation frame surrounding the heat slug adjacent to the exterior surface of the optical transceiver device and configured to insulate heat from the heat slug; and
a heat transfer device directly contacting the heat slug and configured to reduce heat transfer from the heat slug and saki one of the plurality of circuit regions to other circuit regions of the plurality of circuit regions, wherein the insulation frame comprises:

a first portion disposed at a surface of the insulation frame; and a second portion disposed underneath the first portion and separated from the first portion by a gap; and the heat slug comprises a tab configured to be inserted into the qap and be affixed to the insulation frame, a top surface of the tab directly contacting the first portion and a bottom surface of the tab directly contacting the second portion.

17. The system of claim 16, further comprising:

a fin structure configured to release heat;

a heat tube connecting the heat transfer device to the fin structure to transfer the heat away from the optical transceiver device and the heat transfer device; and a projection component disposed on the heat slug and connected to the heat tube, the projection component configured to transfer heat from the heat slug to the heat tube.

18. The system of claim 16, wherein the optical transceiver device comprises a copper base plate disposed at the exterior surface of the optical transceiver device, the copper base plate configured to provide thermal transfer of the heat from the optical transceiver device to the heat transfer device.

19. The system of claim 16, wherein:

a surface of the insulation frame is recessed from a surface of the heat slug; and the insulation frame comprises a nickel-cobalt ferrous alloy.

20. The system of claim 16, wherein the heat slug is a heat spreader comprising an anisotropic carbon material that has a z-axis conductivity greater than a x-y plane conductivity.

21. The system of claim 16, wherein each of the first portion and the second portion comprises a respective hole configured to receive a fastener to fasten the insulation frame to the optical transceiver device.

22. The system of claim 16, wherein:

the one of the plurality of circuit regions comprises a digital signal processor circuit; and another region of the plurality of circuit regions is configured to generate less of the heat than the digital signal processor circuit.

23. A system, comprising:

an optical transceiver device comprising:

a plurality of circuit regions;

a heat slug disposed above one of the plurality of circuit regions, the heat slug extending from the one of the plurality of circuit regions to an exterior surface of the optical transceiver device; and an insulation frame surrounding the heat slug adjacent to the exterior surface of the optical transceiver device and configured to insulate heat from the heat slug; and a heat transfer device directly contacting the heat slug and configured to reduce heat transfer from the heat slug and said one of the circuit regions to other circuit regions of the plurality of circuit regions, wherein:

the optical transceiver device comprises a housing configured to accommodate the plurality of circuit regions, the heat slug, and the insulation frame; and a surface of the heat slug is flush with a surface of the housing.

24. The system of claim 23, further comprising:

a fin structure configured to release heat;

a heat tube connecting the heat transfer device to the fin structure to transfer heat away from the optical transceiver device and the heat transfer device; and a projection component disposed on the heat slug and connected to the heat tube, the projection component configured to transfer heat from the heat slug to the heat tube.

25. The system of claim 23, wherein the optical transceiver device comprises a copper base plate disposed at the exterior surface of the optical transceiver device, the copper base plate configured to provide thermal transfer of heat from the optical transceiver device to the heat transfer device.

26. The system of claim 23, wherein:

a surface of the insulation frame is recessed from a surface of the heat slug; and the insulation frame comprises a nickel-cobalt ferrous alloy.

27. The system of claim 23, wherein the heat slug is a heat spreader comprising an anisotropic carbon material that has a z-axis conductivity greater than a x-y plane conductivity.

28. The system of claim 23, wherein:

said one of the plurality of circuit regions comprises a digital signal processor circuit; and another circuit region of the plurality of circuit regions is configured to generate less heat than the digital signal processor circuit.

29. A quad small form factor pluggable double density device (QSFP-DD) coupled to a heat sink, the QSFP-DD comprising:

a heat slug disposed above a digital signal processing circuit, the heat slug extending from the digital signal processing circuit to an exterior surface of the QSFP-DD and contacting the heat sink, the heat slug comprising a tab; and an insulation frame surrounding the heat slug adjacent to the exterior surface of the QSFP-DD and configured to thermally isolate the heat slug, a surface of the insulation frame is recessed from a surface of the heat slug, wherein the insulation frame comprises:

a first portion disposed at the surface of the insulation frame; and a second portion disposed underneath the first portion and separated from the first portion by a gap, wherein the gap is filled by the tab such that a top surface of the tab directly contacts the first portion and a bottom surface of the tab directly contacts the second portion.

*    *    *    *    *